United States Patent
Oh et al.

(10) Patent No.: US 8,743,644 B2
(45) Date of Patent: Jun. 3, 2014

(54) SEMICONDUCTOR INTEGRATED CIRCUIT HAVING ARRAY E-FUSE AND DRIVING METHOD THEREOF

(75) Inventors: Sang-Mook Oh, Gyeonggi-do (KR); Tae-Sik Yun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/547,582

(22) Filed: Jul. 12, 2012

(65) Prior Publication Data

US 2013/0285709 A1    Oct. 31, 2013

(30) Foreign Application Priority Data

Apr. 30, 2012  (KR) .......................... 10-2012-0045443

(51) Int. Cl.
 G11C 17/18  (2006.01)
 G11C 29/00  (2006.01)
 G11C 29/02  (2006.01)

(52) U.S. Cl.
 CPC .............. *G11C 17/18* (2013.01); *G11C 29/838* (2013.01); *G11C 29/787* (2013.01); *G11C 29/027* (2013.01); *G11C 29/02* (2013.01)
 USPC ................... 365/225.7; 365/189.07; 365/200; 365/201

(58) Field of Classification Search
 CPC .... G11C 17/18; G11C 29/838; G11C 29/787; G11C 29/027
 USPC .......................... 365/225.7, 189.07, 200, 201
 See application file for complete search history.

(56) References Cited

U.S. PATENT DOCUMENTS

| | | | | |
|---|---|---|---|---|
| 4,812,675 A * | 3/1989 | Goetting | ........................... | 326/8 |
| 6,211,710 B1 * | 4/2001 | Madhu et al. | ................. | 327/198 |
| 6,469,949 B1 * | 10/2002 | Hsu et al. | ................... | 365/225.7 |
| 6,704,236 B2 * | 3/2004 | Buer et al. | ............... | 365/210.13 |
| 6,768,222 B1 * | 7/2004 | Ricks | .............................. | 307/32 |
| 7,035,158 B2 * | 4/2006 | Kozuka | ...................... | 365/225.7 |
| 7,295,051 B2 * | 11/2007 | Li et al. | .......................... | 327/143 |
| 7,362,645 B2 * | 4/2008 | Qureshi et al. | ............. | 365/225.7 |
| 7,433,247 B2 * | 10/2008 | Zheng et al. | ............. | 365/189.07 |
| 7,462,894 B2 * | 12/2008 | Lin et al. | ....................... | 257/209 |
| 7,940,595 B2 * | 5/2011 | Kurjanowicz | ................. | 365/226 |

FOREIGN PATENT DOCUMENTS

KR    100562978    3/2006

* cited by examiner

*Primary Examiner* — Viet Q Nguyen
(74) *Attorney, Agent, or Firm* — IP & T Group LLP

(57) ABSTRACT

A semiconductor integrated circuit includes: a normal fuse cell array programmed with a normal fuse data; a dummy fuse cell array programmed with a verifying fuse data; and a sensor configured to read the verifying fuse data from the dummy fuse cell array and read the normal fuse data from the normal fuse cell array, wherein the normal fuse cell array is configured to be read according to a reading result of the dummy fuse cell array.

20 Claims, 3 Drawing Sheets

SEMICONDUCTOR INTEGRATED CIRCUIT HAVING ARRAY E-FUSE AND DRIVING METHOD THEREOF

CROSS-REFERENCE TO RELATED APPLICATIONS

The present application claims priority of Korean Patent Application No. 10-2012-0045443, filed on Apr. 30, 2012, which is incorporated herein by reference in its entirety.

BACKGROUND

1. Field

Exemplary embodiments of the present invention relate to a semiconductor integrated circuit designing technology, and more particularly, to a semiconductor integrated circuit having an array e-fuse (ARE), and a method for driving the semiconductor integrated circuit.

2. Description of the Related Art

A semiconductor integrated circuit includes circuits of the same pattern and also includes a redundancy circuit so that although some circuits have failure according to a process variable, the semiconductor integrated circuit may be used as a normal product.

In particular, a semiconductor memory device typically includes a large number of memory cells integrated into one chip, and if there is a failure in any one of the memory cells, the memory chip is regarded as a defective product and abandoned. As the integration degree of semiconductor integrated circuits increases, more memory cells are integrated into a chip of a limited size. In this state, if a failure occurs in any one memory cell and if the whole memory chip is decided as a defective product, the production yield suffers. To address this issue, semiconductor memory devices are generally equipped with a fuse circuit and a redundancy cell array.

Meanwhile, the fuse circuit is also used when a particular value decided from the testing of a semiconductor integrated circuit is to be set.

A typical fuse circuit uses a line-type metal laser fuse, and a fuse is programmed by selectively disconnecting the metal line with a laser beam. In other words, a semiconductor integrated circuit is provided with desired information according to whether the fuse is blown or not.

Production of the laser fuse circuits, however, takes continuous investment in equipment due to decreasing inter-line pitch as the integration degree of semiconductor integrated circuits increases and takes much time for fuse programming. Further, the area occupied by a fuse array is significant, and the programming is performed in the wafer stage, not at the packaging stage.

Thus, the laser fuses are often replaced by e-fuses to address the above-described features of the laser fuses. An e-fuse basically has a form of a transistor and is programmed by applying a high electric field to a gate and rupture a gate insulation layer.

While an e-fuse circuit may be realized in diverse forms, an array e-fuse (ARE) circuit having unit fuse cells formed in an array is widely used. Generally, when a semiconductor integrated circuit performs an initialization operation, which is a power-up operation, a data programmed in an ARE circuit is read and subsequently stored in a register, and the stored data is used. An operation that the programmed ARE data is stored in the register is referred to as a boot-up operation.

At present, a boot-up operation is initiated based on a reset signal inputted from the outside during an initialization operation. A memory device such as a Double-Data-Rate-3 Dynamic Random Access Memory (DDR3 DRAM) device supports an external reset function in terms of specification, and according to the specification for the DDR3 DRAM, no command is applied to the memory device for a desired time, e.g., approximately 500 μs, after an external reset signal RESETB is enabled to a logic low level. Thus, the memory device does not perform any other operation during the time. If the memory device performs the boot-up operation for a time specified by the external reset signal, no malfunctions occur.

However, semiconductor integrated circuits that do not support the external reset function may not secure the time for stably performing the boot-up operation on the array e-fuse.

SUMMARY

An embodiment of the present invention is directed to a semiconductor integrated circuit that may stably perform a boot-up operation on an array e-fuse even if the semiconductor integrated circuit may not support an external reset function, and a method for driving the semiconductor integrated circuit.

In accordance with an embodiment of the present invention, a semiconductor integrated circuit includes: a normal fuse cell array programmed with a normal fuse data; a dummy fuse cell array programmed with a verifying fuse data; and a sensor configured to read the verifying fuse data from the dummy fuse cell array and read the normal fuse data from the normal fuse cell array, wherein the normal fuse cell array is configured to be read according to a reading result of the dummy fuse cell array.

In accordance with another embodiment of the present invention, a semiconductor integrated circuit includes: a normal fuse cell array programmed with a normal fuse data and outputting the normal fuse data through a plurality of bit lines by sequentially enabling a plurality of word lines in response to a main count signal that is enabled periodically; a verification counter configured to generate a verification count signal that is enabled periodically in response to a power-up signal; a dummy fuse cell array programmed with a verifying fuse data and outputting the verifying fuse data through the multiple bit lines by periodically enabling a verifying word line until a main count initiation signal is enabled in response to the verification count signal; a sensor configured to read the verifying fuse data and the normal fuse data that are loaded on the multiple bit lines in response to a sense amplification enable signal; a verifier configured to enable the main count initiation signal in response to combining a signal corresponding to the verifying fuse data among output signals of the sensor; a main counter configured to generate the main count signal in response to the main count initiation signal; and a register configured to store a signal corresponding to the normal fuse data among the output signals of the sensor.

In accordance with yet another embodiment of the present invention, a method for driving a semiconductor integrated circuit includes: reading a dummy fuse cell array that is programmed with a verifying fuse data in response to a power-up signal; determining whether a result of reading the dummy fuse cell array coincides with an expected value; and reading a normal fuse cell array that is programmed with a normal fuse data when the result of reading the dummy fuse cell array is determined to coincide with the expected value.

DETAILED DESCRIPTION

Figure 1:
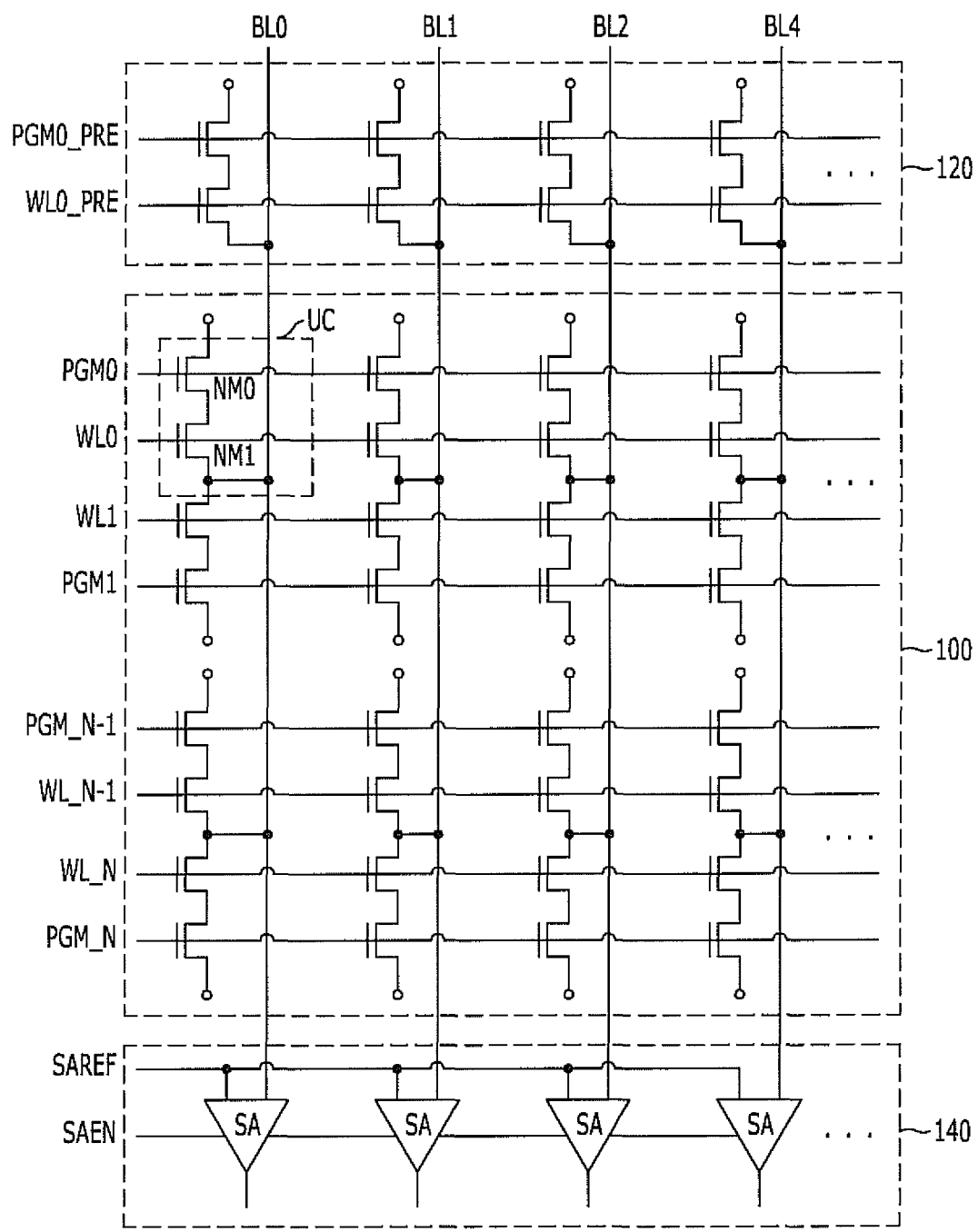
FIG. 1 is a schematic diagram illustrating an array e-fuse (ARE) circuit of a semiconductor integrated circuit in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a schematic diagram illustrating an array e-fuse (ARE) circuit of a semiconductor integrated circuit in accordance with an embodiment of the present invention.

Referring to FIG. 1, the ARE circuit in accordance with the embodiment of the present invention includes a normal fuse cell array 100, a dummy fuse cell array 120, and a sensor 140. The normal fuse cell array 100 is selectively programmed based on a program voltage PGM<0:N> and includes a plurality of unit e-fuse cells UC coupled with word lines WL<0:N> and bit lines BL<0:M> and arrayed in the form of array. The dummy fuse cell array 120 is programmed with a verifying fuse data based on a verifying program voltage PGM_PRE and includes a plurality of unit e-fuse cells UC coupled with a verifying word line WL0_PRE and the bit lines BL<0:M> and arrayed in the form of array. The sensor 140 reads the programming states of the normal fuse cell array 100 and the dummy fuse cell array 120.

The dummy fuse cell array 120 is added to verify whether the power supply enters a stable state during the initialization operation, which is also referred to as a power-up operation, of the semiconductor integrated circuit and whether a boot-up operation may be performed on the normal fuse cell array 100 or not. The unit e-fuse cells UC disposed in the dummy fuse cell array 120 have the same structure as the unit e-fuse cells UC of the normal fuse cell array 100, and the dummy fuse cell array 120 may share the sensor 140 with the normal fuse cell array 100. Therefore, the bit lines BL<0:M> of the normal fuse cell array 100 may be used for the dummy fuse cell array 120.

According to an example, the program voltage PGM<0:N> and the verifying program voltage PGM_PRE may be set to the same voltage level and used.

The sensor 140 includes a plurality of sense amplifiers SA for sensing and amplifying the voltage level of each of the bit lines BL<0:M> based on a reference voltage SAREF.

Hereinafter, the structure and operation of the unit e-fuse cells UC are described to understand the program operation and read operation of a basic ARE circuit.

Each of the unit e-fuse cells UC includes a first NMOS transistor MN0 having a source coupled with a source voltage terminal and a gate for receiving the corresponding program voltage PGM<0:N>, and a second NMOS transistor MN1 having a source coupled with a drain of the first NMOS transistor MN0, a drain coupled with a corresponding bit line BL<0:M>, and a gate coupled with a corresponding word line WL<0:N>. The voltage level of the source voltage terminal may be different according to the voltage level of the program voltage PGM<0:N>. According to an example, a gate-source voltage VGS, e.g., approximately 6V, strong enough to rupture a gate insulation layer of the first NMOS transistor MN0 is generated. Thus, if the program voltage PGM<0:N> is sufficiently high, a ground voltage may be applied to the source voltage terminal, and when, the program voltage PGM<0:N> is set to be low, a negative voltage is applied. The program voltage PGM<0:N> is applied when a program operation is performed. When a word line WL<0:N> is selected, the second NMOS transistor MN1 coupled with the word line is turned on, and thus a particular data stored therein is outputted through a corresponding bit line according to whether the first NMOS transistor MN0 is ruptured or not.

Figure 2:
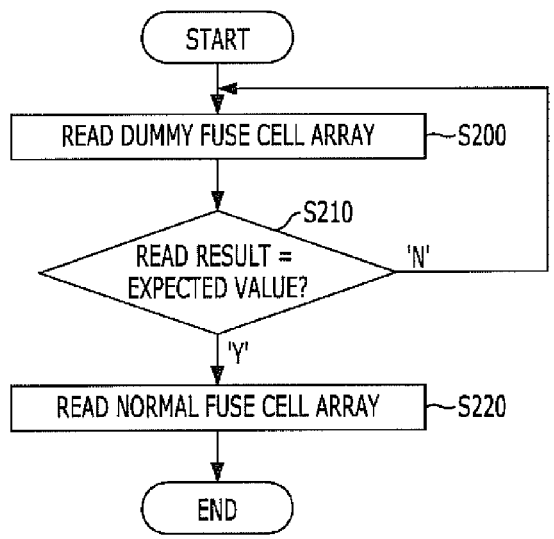
FIG. 2 is a flowchart describing a boot-up operation of the ARE circuit shown in FIG. 1.

FIG. 2 is a flowchart describing a boot-up operation of the ARE circuit shown in FIG. 1. Referring to FIGS. 1 and 2, a boot-up operation of the ARE circuit in accordance with the embodiment of the present invention is described with reference to FIGS. 1 and 2.

For illustration purposes, it is assumed that the normal fuse cell array 100 is already programmed with appropriate information, such as repair address information, and the dummy fuse cell array 120 is already programmed with a verifying fuse data. As described above, the program operation is performed by selectively applying the program voltage PGM<0:N> and the verifying program voltage PGM_PRE.

First of all, the dummy fuse cell array 120 is read during a power-up operation of the semiconductor integrated circuit in step S200. Herein, a verifying fuse data is loaded onto the bit lines BL<0:M> by enabling the verifying word line WL0_PRE of the dummy fuse cell array 120, and the polarity of the data loaded on the bit lines BL<0:M> are sensed by enabling the multiple sense amplifiers SA of the sensor 140.

Subsequently, it is determined in step S210 that the sensed data, which is a read data, of the sensor 140 coincides with an expected value corresponding to the programmed verifying fuse data. If the sensed result of the sensor 140 does not coincide with the expected value, the dummy fuse cell array 120 is read again.

If the sensed result of the sensor 140 coincides with the expected value, the normal fuse cell array 100 is read in step S220. Here, the fuse data is loaded onto the bit lines BL<0:M> by sequentially enabling the multiple word lines WL<0:N> of the normal fuse cell array 100, and the polarity of the signal representing the data is sensed by enabling the multiple sense amplifiers SA of, the sensor 140. The sensor 140 senses the fuse data corresponding to each of the word lines WL<0:N> and the sensed fuse data is stored in the register. In other words, the sequential enabling of the word lines, sensing, and storing in the register together form one cycle.

As described above, when the normal fuse cell array 100 is read after the power-up state is verified as a result of reading the dummy fuse cell array 120, the boot-up operation may be performed stably in the ARE circuit even in a semiconductor integrated circuit that does not support an external reset function.

Figure 3:
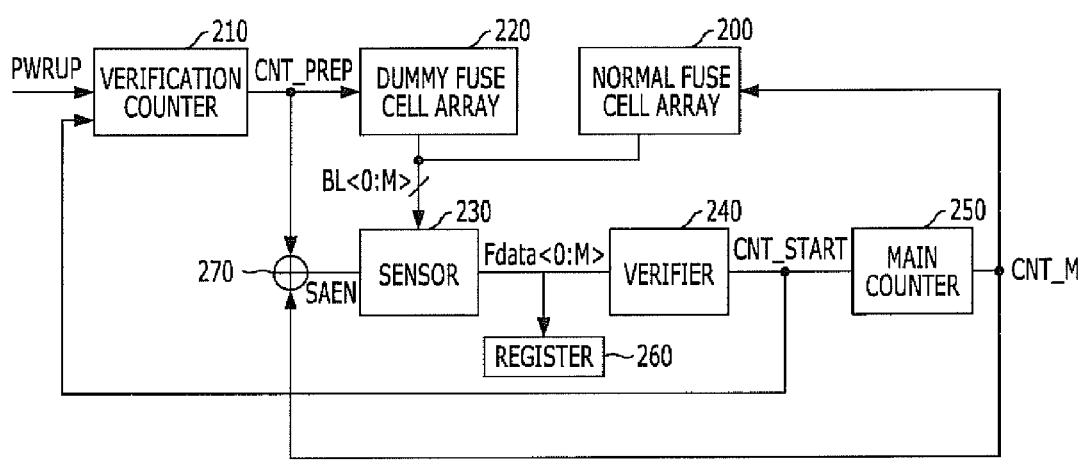
FIG. 3 is a block diagram illustrating an ARE circuit of a semiconductor integrated circuit in accordance with another embodiment of the present invention.

FIG. 3 is a block diagram illustrating an ARE circuit of a semiconductor integrated circuit in accordance with another embodiment of the present invention.

Referring to FIG. 3, the ARE circuit in accordance with the embodiment of the present invention includes a normal fuse cell array 200, a verification counter 210, a dummy fuse cell array 220, sensor 230, a verifier 240, a main counter 250, and a register 260. The normal fuse cell array 200 is programmed with normal fuse data and outputs a normal fuse data through a plurality of bit lines BL<0:M> by sequentially enabling a plurality of word lines in response to a main count signal CNT_M. The verification counter 210 generates a verification count signal CNT_PREP that is enabled for a certain period in response to a power-up signal PWRUP. The dummy fuse cell array 220 is programmed with a verifying fuse data and outputs a verifying fuse data through the multiple bit lines BL<0:M> by enabling a verifying word Fine until a main count initiation signal CNT_START is enabled in response to the verification count signal CNT_PREP. The sensor 230 reads the verifying fuse data and the normal fuse data that are loaded on the bit lines BL<0:M> in response to a sense amplification enable signal SAEN. The verifier 240 combines a signal corresponding to the verifying fuse data among the output signals FDATA<0:M> of the sensor 230 and when an expected result is obtained, the verifier 240 enables the main count initiation signal CNT_START. The main counter 250 generates the main count signal CNT_M in response to the main count initiation signal CNT_START. The register 260 stores a signal corresponding to the normal fuse data among the output signals FDATA<0:M> of the sensor 230.

Here, the sense amplification enable signal SAEN is generated by mixing the verification count signal CNT_PREP and the main count signal CNT_M, and a mixer 270 may be any reasonably suitable logic circuit for performing an OR operation on the verification count signal CNT_PREP and the main count signal CNT_M.

The detailed structures of the normal fuse cell array 200, the dummy fuse cell array 220, and the sensor 230 may be the same as those shown in FIG. 1.

The verifier 240 may be any reasonably suitable circuit for performing an AND operation on the signal corresponding to the verifying fuse data among the output signals FDATA<0:M> of the sensor 230.

The main counter 250 is formed to performing a counting operation for a number of times equal to the number of word lines disposed in the normal fuse cell array 200.

Figure 4:
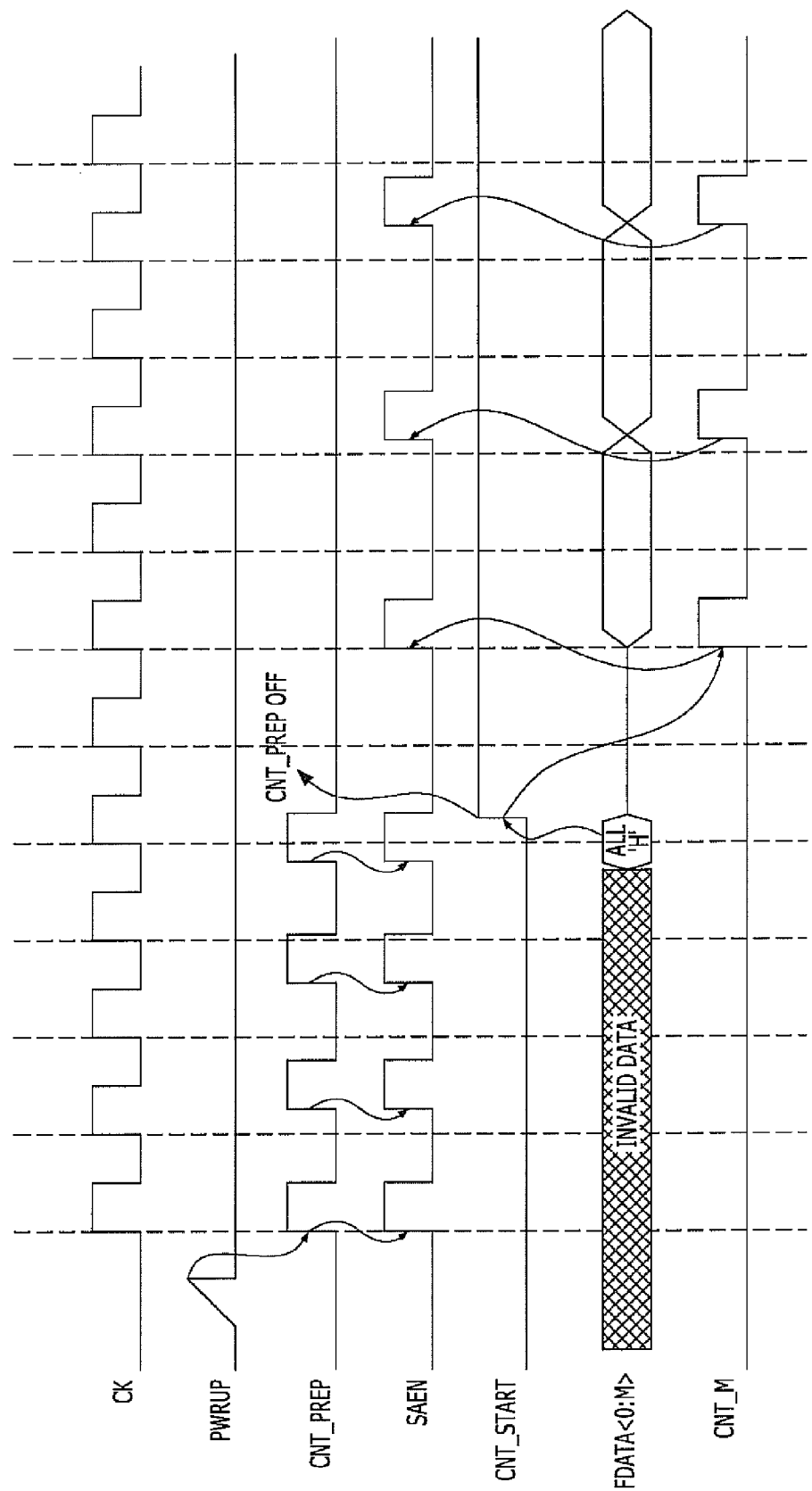
FIG. 4 is a timing diagram illustrating the ARE circuit shown in FIG. 3.

FIG. 4 is a timing diagram illustrating the ARE circuit shown in FIG. 3. Hereinafter, a boot-up operation of the ARE circuit in accordance with the embodiment of the present invention is described with reference to FIGS. 3 and 4.

Here, it is assumed that the normal fuse cell array 200 is programmed with appropriate information, for example, repair address information, and the dummy fuse cell array 220 is programmed with a verifying fuse data.

First of all, when the power-up signal PWRUP is enabled during the power-up operation of the semiconductor integrated circuit, the verification counter 210 is enabled to perform a counting operation for a certain period.

The verifying word line of the dummy fuse cell array 220 is enabled whenever the verification count signal CNT_PREP outputted from the verification counter 210 is enabled, and the dummy fuse, cell array 220 is read by enabling the sense amplification enable signal SAEN. Since the power supply is instable within the semiconductor integrated circuit right after the power-up operation is performed, the verifying fuse data programmed in the dummy fuse cell array 220 is not accurately sensed is high. If the expected values obtained when the fuse cells corresponding to the multiple bit lines BL<0:M> are all ruptured are in a logic high level, the verifier 240 determines whether all of the output signals FDATA<0:M> of the sensor 230 are in a logic high level through an AND operation of all the output signals FDATA<0:M> of the sensor 230. If it is determined from the verifying operation in the verifier 240 that not all the output signals FDATA<0:M> of the sensor 230 are in a logic high level, the main count initiation signal CNT_START continues to maintain the logic low level and the dummy fuse cell array 220 is read again at the next counting period. Meanwhile, if it is determined from the verifying operation in the verifier 240 that all the output signals FDATA<0:M> of the sensor 230 are in a logic high level, the main count initiation signal CNT_START transitions to a logic high level.

When the main count initiation signal CNT_START transitions to a logic high level, the verification counter 210 is disabled, and the main counter 250 is enabled to perform a counting operation for a certain period.

Whenever the main count signal CNT_M is enabled, the normal fuse data is read and stored in the register 260 by sequentially enabling the multiple word lines of the normal fuse cell array 200. More specifically, whenever the main count signal CNT_M is enabled, the word lines of the normal fuse cell array 200 are sequentially enabled and this enables the sense amplification enable signal SAEN as well. Accordingly, the fuse data is loaded onto the bit lines BL<0:M>, and the sensor 230 comes to sense the polarity of the data that is loaded onto the bit lines BL<0:M>. The sensor 230 senses the fuse data corresponding to the word lines, and the sensed fuse data FDATA<0:M> are stored in the register 260. Here, the sequential enabling of the word lines, sensing, and storing in the register together form one cycle.

Here, all the operations not related to the counting period may be performed in synchronization with a clock signal CK.

As described above, when the normal fuse cell array 200 is read after the power-up state is verified based on the result of reading the dummy fuse cell array 220, a boot-up operation may be performed stably on the ARE circuit even in a semiconductor integrated circuit that does not support an external reset function.

According to an embodiment of the present invention, a semiconductor integrated circuit may stably perform a boot-up operation on an array e-fuse even though the semiconductor integrated circuit does not support an external reset function.

While the present invention has been described with respect to the specific embodiments, it will be apparent to those skilled in the art that various changes and modifications may be made without departing from the spirit and scope of the invention as defined in the following claims.

For example, the logics exemplarily presented in the embodiments of the present invention may be replaced with another Logic or omitted according to the kind of the used signal and the enable level of the signal.

Also, although the above embodiments of the present invention illustrates a case where one verifying word line is disposed in the dummy fuse cell array, a plurality of verifying word lines may be disposed, if necessary.

What is claimed is:
1. A semiconductor integrated circuit, comprising:
a normal fuse cell array programmed with a normal fuse data;
a dummy fuse cell array programmed with a verifying fuse data; and
a sensor configured to read the verifying fuse data from the dummy fuse cell array and read the normal fuse data from the normal fuse cell array,
wherein the normal fuse cell array is configured to be read when the verifying fuse data of the dummy fuse cell array is matched with an expected value.
2. The semiconductor integrated circuit of claim 1, wherein the dummy fuse cell array includes a plurality of unit e-fuse cells that are coupled with a verifying word line and a plurality of bit lines.

3. The semiconductor integrated circuit of claim 1, wherein the normal fuse cell array includes a plurality of unit e-fuse cells that are coupled with a plurality of normal word lines and a plurality of bit lines.

4. The semiconductor integrated circuit of claim 2, wherein the dummy fuse cell array shares the multiple bit lines with the normal fuse cell array.

5. The semiconductor integrated circuit of claim 2, wherein each of the unit e-fuse cells of the dummy fuse cell array includes:
   a first NMOS transistor having a source coupled with a source voltage terminal and a gate for receiving a verifying program voltage; and
   a second NMOS transistor having a source coupled with a drain of the first NMOS transistor, a drain coupled with a corresponding bit line, and a gate coupled with the verifying word line.

6. The semiconductor integrated circuit of claim 3, wherein each of the unit e-fuse cells of the normal fuse cell array includes:
   a first NMOS transistor having a source coupled with a source voltage terminal and a gate for receiving a corresponding program voltage; and
   a second NMOS transistor having a source coupled with a drain of the first NMOS transistor, a drain coupled with a corresponding bit line, and a gate coupled with a corresponding word line.

7. The semiconductor integrated circuit of claim 2, wherein all of the unit e-fuse cells of the dummy fuse cell array are configured to be ruptured.

8. A semiconductor integrated circuit, comprising:
   a normal fuse cell array programmed with a normal fuse data and outputting the normal fuse data through a plurality of bit lines by sequentially enabling a plurality of word lines in response to a main count signal that is enabled periodically;
   a verification counter configured to generate a verification count signal that is enabled periodically in response to a power-up signal;
   a dummy fuse cell array programmed with a verifying fuse data and outputting the verifying fuse data through the multiple bit lines by periodically enabling a verifying word line until a main count initiation signal is enabled in response to the verification count signal;
   a sensor configured to read the verifying fuse data and the normal fuse data that are loaded on the multiple bit lines in response to a sense amplification enable signal;
   a verifier configured to enable the main count initiation signal in response to combining a signal corresponding to the verifying fuse data among output signals of the sensor;
   a main counter configured to generate the main count signal in response to the main count initiation signal; and
   a register configured to store a signal corresponding to the normal fuse data among the output signals of the sensor.

9. The semiconductor integrated circuit of claim 8, further comprising:
   a mixer configured to generate the sense amplification enable signal by mixing the verification count signal and the main count signal.

10. The semiconductor integrated circuit of claim 9, wherein the mixer includes a logic for performing an OR operation on the verification count signal and the main count signal.

11. The semiconductor integrated circuit of claim 8, wherein the verifier includes a logic for performing an AND operation on a signal corresponding to the verifying fuse data among the output signals of the sensor.

12. The semiconductor integrated circuit of claim 8, wherein the dummy fuse cell array includes a plurality of unit e-fuse cells that are coupled with a verifying word line and the multiple bit lines.

13. The semiconductor integrated circuit of claim 8, wherein the normal fuse cell array includes a plurality of unit e-fuse cells that are coupled with the multiple word lines and the multiple bit lines.

14. The semiconductor integrated circuit of claim 12, wherein each of the unit e-fuse cells includes:
   a first NMOS transistor having a source coupled with a source voltage terminal and a gate for receiving a verifying program voltage; and
   a second NMOS transistor having a source coupled with a drain of the first NMOS transistor, a drain coupled with a corresponding bit line, and a gate coupled with the verifying word line.

15. The semiconductor integrated circuit of claim 13, wherein each of the unit e-fuse cells includes:
   a first NMOS transistor having a source coupled with a source voltage terminal and a gate for receiving a corresponding program voltage; and
   a second NMOS transistor having a source coupled with a drain of the first NMOS transistor, a drain coupled with a corresponding bit line, and a gate coupled with a corresponding word line.

16. The semiconductor integrated circuit of claim 12, wherein all of the unit e-fuse cells of the dummy fuse cell array are configured to be ruptured.

17. A method for driving a semiconductor integrated circuit, comprising:
   reading a dummy fuse cell array that is programmed with a verifying fuse data in response to a power-up signal;
   determining whether a result of reading the dummy fuse cell array coincides with an expected value; and
   reading a normal fuse cell array programmed with a normal fuse data when the result of reading the dummy fuse cell array is determined to coincide with the expected value.

18. The method of claim 17, further comprising:
   reading the dummy fuse cell array again when the result of reading the dummy fuse cell array is determined not to coincide with the expected value.

19. The method of claim 17, wherein the reading of the dummy fuse cell array comprises:
   loading the verifying fuse data on a plurality of bit lines by enabling one verifying word line that is disposed in the dummy fuse cell array; and
   sensing a polarity of the data loaded on the multiple bit lines.

20. The method of claim 17, wherein the reading of the normal fuse cell array comprises:
   loading the normal fuse data on the multiple bit lines by enabling a selected word line among a plurality of word lines that are disposed in the normal fuse cell array;
   sensing a polarity of a signal representing the data loaded on the multiple bit lines;
   storing the sensed data in a register; and
   repeating a cycle of the loading of the normal fuse data on the multiple bit lines, the sensing of the polarity of the data loaded on the multiple bit lines, and the storing of the sensed data in the register for a next word line disposed on the normal fuse cell array.

* * * * *